United States Patent [19]

Van Vaals et al.

[11] Patent Number: 4,952,879
[45] Date of Patent: Aug. 28, 1990

[54] MAGNETIC RESONANCE APPARATUS WITH UNCOUPLED RF COILS

[75] Inventors: Johannes J. Van Vaals; Anthonie H. Bergman, Eindhoven, both of Netherlands

[73] Assignee: U. S. Philips Corporation, N.Y.

[21] Appl. No.: 339,031

[22] Filed: Apr. 14, 1989

[30] Foreign Application Priority Data

Apr. 26, 1988 [NL] Netherlands .......................... 8801077

[51] Int. Cl.⁵ ............................................ G01R 33/20
[52] U.S. Cl. ...................................... 324/322; 324/318
[58] Field of Search ............... 324/300, 307, 309, 318, 324/322

[56] References Cited

U.S. PATENT DOCUMENTS

| | | | |
|---|---|---|---|
| 4,129,822 | 12/1978 | Traficante | 324/322 |
| 4,691,164 | 9/1987 | Haragashira | 324/318 |
| 4,700,137 | 10/1987 | Yoda et al. | 324/318 |
| 4,712,069 | 12/1987 | Kommer et al. | 324/312 |
| 4,739,269 | 4/1988 | Kopp | 324/318 |
| 4,812,764 | 3/1989 | Bendall | 324/318 |
| 4,816,765 | 3/1989 | Boskamp | 324/318 |

OTHER PUBLICATIONS

Rajan et al., "A Novel Double-Tuned Circuit for in Vivo NMR" Journal of Magnetic Resonance, vol. 74, No. 1, Aug. 1987, pp. 147–154.
Schnall et al., "The Application of Overcoupled Tank Circuits to NMR Probe Design": Journal of Magnetic Resonance, vol. 67, No. 1, Mar. 1986, pp. 129–134.
Jiang et al., "An Efficient Double-Tuned C/H Probe Circuit for CP/MAS NMR and Its Importance in Linewidths" Journal of Magnetic Resonance, vol. 71, No. 3, 2/15/87, pp. 485–494.

Primary Examiner—Michael J. Tokar
Attorney, Agent, or Firm—William Squire

[57] ABSTRACT

In a magnetic resonance apparatus coils of an rf coil system are incorporated for detection of magnetic resonant signals at mutually different frequencies in resonant circuits having a zero impedance for the natural frequency and an infinite impedance for a given deviating frequency. In the switching circuits a coaxial cable is used having a length which has a reactance in parallel with a second reactance to form a tuned circuit adapted to the desired frequency.

5 Claims, 1 Drawing Sheet

MAGNETIC RESONANCE APPARATUS WITH UNCOUPLED RF COILS

The invention relates to a magnetic resonance apparatus having a magnet system for generating a steady magnetic field in the measuring space, a coil system for generating gradient fields in the measuring space and comprising an rf coil system for excitation and detection of magnetic resonant signals.

Such a magnetic resonance apparatus is known from EP 196134 corresponding to U.S. Pat. No. 4,712,069. An apparatus described in said Patent Specification has been made suitable for working with several rf coils, for example, in quadrature mode, by incorporating the coils in a switching circuit for impedance and phase matching, so that disturbing phase shifts between excitation and detection are avoided. The apparatus is restricted to measuring at a single rf frequency with the whole rf coil system.

It is the object of the invention to provide a switching circuit for an rf coil system with which it is possible to avoid disturbing mutual influencing of several coils of an rf coil system tuned to different frequencies so that measurements can be carried out at several frequencies simultaneously or in a rapid succession. A magnetic resonance apparatus of the type mentioned in the opening paragraph is for that purpose characterized according to the invention in that coils of the rf coil system to be uncoupled are incorporated in a resonant circuit having substantial zero impedance for a natural frequency $f_0$ and substantial infinite impedance for a frequency $f_1$ deviating therefrom of a coil to be uncoupled therefrom.

Since in an rf coil system according to the invention each coil can be detuned for a given frequency $f_1$ of another coil, mutual influencing is avoided and measuring can be carried out at several frequencies simultaneously or in rapid succession.

In a preferred embodiment resonant circuits comprise a coaxial cable corresponding to $n/4\lambda$ of a frequency $f_1$ to be screened, in which n is an integer which integer is even for a coaxial cable having a short-circuited free end and is odd for a coaxial cable having an open free end. As a result of this the input impedance of the cable for the frequency $f_0$ is equal to zero.

In a further preferred embodiment a capacity and/or an inductance is/are connected parallel to the coaxial cable by optional tuning of which, together with the coaxial cable impedance, there may be tuned to a desired frequency $f_0$ and undesired frequency $f_1$ can be avoided. In particular if a coaxial cable for a given frequency is equivalent to a capacity value, a parallel-arranged tuning circuit may be used having an adjustable inductance or a parallel-arranged tuning circuit having a fixed inductance and a tunable capacitor. By means of a coaxial cable which for a given frequency is equivalent to an inductance, a parallel-arranged tuning circuit may be used having an adjustable capacitor or, but that seems to be less attractive, with a fixed capacitor and a tunable inductance. In this manner resonant circuits can be realized which are built up from passive electronic elements for which the impedance for a natural frequency is equal to zero and for a frequency to be avoided is equal to infinite. As a result of this the Q-factor of the resonant circuit with the natural frequency is not attacked so long as the damping of the coaxial cable is so low that the Q-factor thereof is much higher than that of the whole circuit, which is simple to realize. The Q-factor of further elements is not of importance. For frequencies to be avoided the circuit is fully uncoupled by the infinitely high impedance applying thereto. Higher requirements need not be imposed upon the inductances and capacitors to be incorporated in the resonant circuits as far as the Q-factor is concerned and hence components having a high breakdown resistance can be chosen. As a result of this the solution is also sufficiently safe for comparatively strong rf fields. This latter is in contrast with circuits having pin-diodes and the like.

A few embodiments according to the invention will now be described in greater detail with reference to the drawings, in which.

Figure 1:
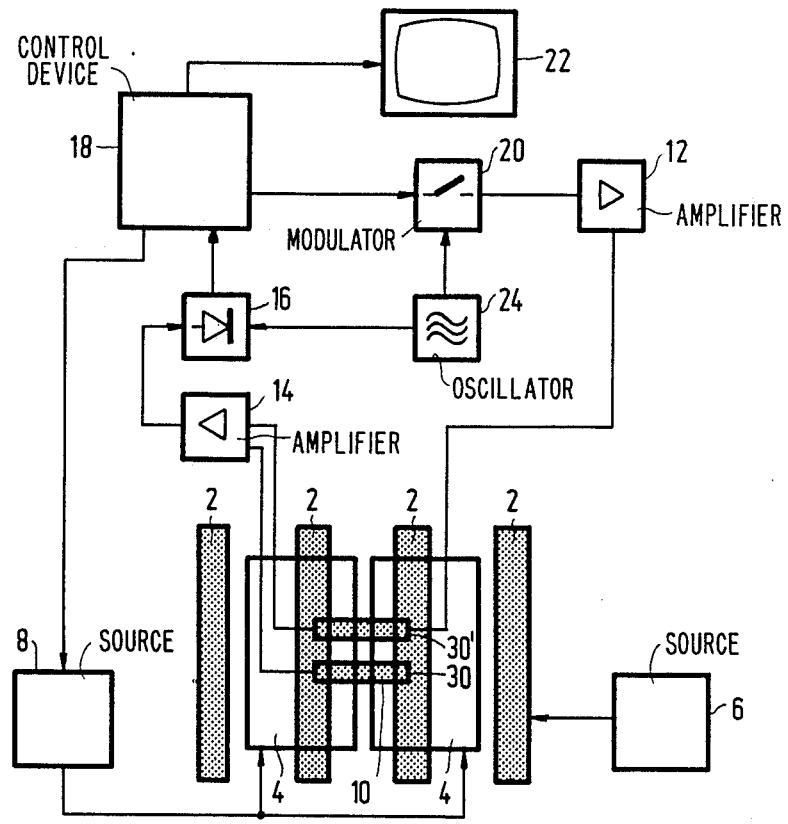
FIG. 1 shows a magnetic resonance apparatus according to the invention.

A magnetic resonance apparatus as shown in FIG. 1 comprises magnet coils 2 for generating a stationary magnetic field, magnet coils 4 for generating a gradient field, a supply source 6 for the magnet coils 2 and a supply source 8 for the magnet coils 4. A coil system 10 serves both to generate a radio frequency pulsated magnetic field and for that purpose can be connected to a radio-frequency source via amplifier 12, and for detecting nuclear spin resonance generated in an object to be measured by the radio-frequency field. The detecting coils 30 and 30' of the coil system 10 are connected to a detection amplifier 14. The amplifier 14 is connected to a phase-sensitive rectifier 16 which is connected to a central control device 18. The central control device 18 further controls a modulator 20 which applies a radio-frequency signal to amplifier 12, the supply source 8 for the gradient field and a monitor 22 for imaging. An rf oscillator 24 controls the modulator 20 to generate the rf signal applied to amplifier 12 and controls the rectifier 16 which processes the measured signals sensed by coils 30 and 30' to control device 18.

Figures 2A, 2B, 2C:
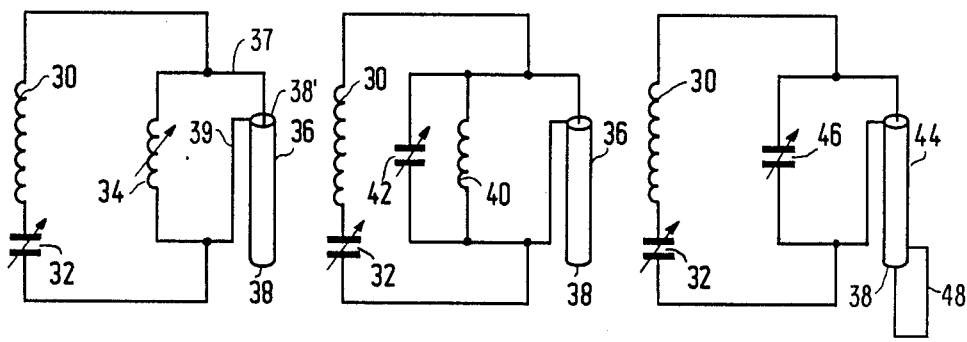
FIGS. 2a, 2b and 2c shows a few embodiments of switching circuits for rf coils therefor.

FIG. 2a shows one of two switching circuits. The circuit of FIG. 2a has an rf coil 30 in series with an adjustable capacitor 32 and parallel thereto a parallel-arrangement of a variable inductance 34 and a coaxial cable 36. Lead 37 is connected to one end of coil 30, to coil 34 and to one end 38' of cable 36. Lead 39 is connected to end 38' of cable 36 and to the junction of coil 34 and variable capacitor 32 which is connected to the other end of coil 30. It is important for the connections of leads 37 and 39 to be connected to end 38' for the cable to operate as desired. Cable 36 has for a given frequency f a length L corresponding to $n/4\lambda$, where n is an integer and an odd number and having an open end 38. It should be understood that this circuit is representative of an identical circuit connected to coil 30' and not shown. The impedance of the coaxial cable 36 corresponds to a capacitance for a given frequency f if $n/2\lambda < L < (n/2 + \frac{1}{2})\lambda$. The circuit then has substantial zero impedance for the natural frequency $f_0$ and substantial infinite impedance for the frequency $f_1$.

In FIG. 2b a parallel-arrangement of an inductance 40 and an adjustable capacitor 42 has been added to a corresponding coaxial cable 36. In this case the advantage is obtained that a variable capacity may be used, which often is simpler than a variable inductance.

FIG. 2c shows a switching circuit again comprising an rf coil 30 with adjustable capacity 32 and in this case a parallel-arrangement of a coaxial cable 44 with a short-circuited end 38 and a variable capacitor 46. The impedance of the coaxial cable 44 corresponds to an inductance for again a given frequency f if $n/4\lambda < 1 < (n/4 + \frac{1}{4})\lambda$, where n is an integer equal to 0, 1, 2, 3. The circuit now has at zero impedance for a natural frequency again an infinitely large impedance for a frequency $f_0$ and may hence be used quite independently thereof as a measuring coil.

Although embodiments have been described hereinbefore with reference to applications having two coils to be mutually uncoupled the invention may also be used for application of more than two coils in the rf coil system. For uncoupling coaxial cables having, for undesired frequencies, an infinite impedance are incorporated in the coil circuit, which, under the direction of the given formulae for the cable lengths, is very well possible.

What is claimed is:

1. A magnetic resonance apparatus having a magnet system for generating a stationary magnetic field in the measuring space, a coil system for generating gradient fields in the measuring space and comprising an rf coil system for excitation and detection of magnetic resonant signals, characterized in that a coil of the rf coil system to be uncoupled is incorporated in a resonant circuit having substantial zero impedance for a resonant frequency and substantial infinite impedance for a frequency deviating therefrom of a coil to be uncoupled therefrom, said resonant circuit comprising a coaxial cable forming a reactive impedance connected in parallel to the rf coil and having an adjustable reactive impedance connected in parallel thereto forming a tuned circuit therewith in parallel to said coil.

2. A magnetic resonance apparatus as claimed in claim 1, characterized in that the coaxial cable has an open end and the parallel-arranged impedance is an adjustable inductance.

3. A magnetic resonance apparatus as claimed in claim 1, characterized in that the coaxial cable has an open end and the parallel-arranged impedance is a parallel arrangement of a fixed inductance and a variable capacitor.

4. A magnetic resonance apparatus as claimed in claim 1, characterized in that the coaxial cable has a short-circuited end and the parallel-arranged impedance constitutes an adjustable capacity.

5. A magnetic resonance apparatus as claimed in claim 1 where said cable is dimensioned $n/2\lambda < L < (n/2 + \frac{1}{4})\lambda$, where L is the length of the cable and n is an odd interger or 0.

* * * * *